United States Patent
Iwase et al.

(10) Patent No.: US 7,294,953 B2
(45) Date of Patent: Nov. 13, 2007

(54) STACKED PIEZOELECTRIC ELEMENT AND METHOD OF FABRICATION THEREOF

(75) Inventors: Akio Iwase, Nishio (JP); Shige Kadotani, Chita-gun (JP); Tetsuji Itou, Kariya (JP)

(73) Assignee: Denso Corporation, Kariya, Aichi-pref. (JP)

( * ) Notice: Subject to any disclaimer, the term of this patent is extended or adjusted under 35 U.S.C. 154(b) by 35 days.

(21) Appl. No.: 11/312,487

(22) Filed: Dec. 21, 2005

(65) Prior Publication Data

US 2006/0138908 A1 Jun. 29, 2006

(30) Foreign Application Priority Data

Dec. 24, 2004 (JP) ............... 2004-374466

(51) Int. Cl.
*H01L 41/083* (2006.01)
*H01L 41/047* (2006.01)

(52) U.S. Cl. .................................... 310/366

(58) Field of Classification Search ............... 310/328, 310/366

See application file for complete search history.

(56) References Cited

U.S. PATENT DOCUMENTS

| | | | |
|---|---|---|---|
| 7,225,514 B2* | 6/2007 | Iwase et al. .......... 29/25.35 |
| 2002/0043901 A1* | 4/2002 | Kihara et al. .......... 310/366 |
| 2004/0169442 A1* | 9/2004 | Senoo et al. .......... 310/328 |
| 2004/0178701 A1* | 9/2004 | Sato et al. ............ 310/328 |
| 2005/0168106 A1* | 8/2005 | Iwase et al. .......... 310/328 |
| 2005/0231074 A1* | 10/2005 | Iwase et al. .......... 310/328 |
| 2005/0264138 A1* | 12/2005 | Ohmori et al. ........ 310/328 |

FOREIGN PATENT DOCUMENTS

| | | |
|---|---|---|
| JP | 6-232474 | 8/1994 |
| JP | 7-154006 | 6/1995 |
| JP | 7-162049 | 6/1995 |
| JP | 2001-210886 | * 8/2001 |
| JP | 2002-285937 | 10/2002 |
| JP | 2003-243738 | * 8/2003 |
| JP | 2004-95593 | 3/2004 |
| JP | 2004-297043 | * 10/2004 |

* cited by examiner

*Primary Examiner*—Thomas M. Dougherty
(74) *Attorney, Agent, or Firm*—Nixon & Vanderhye P.C.

(57) ABSTRACT

This invention provides a stacked piezoelectric element that has excellent durability and reliability by ensuring reliable electrical conduction between internal electrode layer and conductive adhesive, and a method of fabricating such a stacked piezoelectric element, wherein the stacked piezoelectric element 1 comprises: a ceramic stack 10 constructed by alternately stacking piezoelectric layers 11 made of a piezoelectric material and internal electrode layers 21, 22 having electrical conductivity; and external electrodes 32 bonded to the side faces 101 and 102 of the ceramic stack 10 via an electrically conductive adhesive 31. The side faces 101 and 102 of the ceramic stack 10 are provided with electrode recesses 23 each formed by indenting a portion of the edge of each of the internal electrode layers 21, 22 in the stacking direction thereof thereby forming a gap between it and the overlying piezoelectric layer 11, and the conductive adhesive 31 is applied so as to enter the electrode recesses 23 from the side faces 101 and 102 of the ceramic stack 10.

3 Claims, 16 Drawing Sheets

STACKED PIEZOELECTRIC ELEMENT AND METHOD OF FABRICATION THEREOF

This application is a new U.S. patent application that claims benefit of JP 2004-374466, filed 24 Dec. 2004, the entire contents of which being herein incorporated by reference.

FIELD OF THE INVENTION

The present invention relates to a stacked piezoelectric element, adapted for use as a piezoelectric actuator or the like, and a method of fabrication thereof.

BACKGROUND OF THE INVENTION

In recent years, the development of automotive fuel injectors, etc., that use stacked piezoelectric elements as piezoelectric actuators has been proceeding to address automotive environmental problems and other automotive related issues such as fuel economy and exhaust emissions.

A stacked piezoelectric element generally comprises: a ceramic stack constructed by alternately stacking a piezoelectric layer made of a piezoelectric material and an internal electrode layer (or internal electrode) having electrical conductivity; and an external electrode bonded to a side face of the ceramic stack via an electrically conductive adhesive. An end face of the internal electrode layer is exposed in the side face of the ceramic body so that the end face contacts the conductive adhesive to attain electrical conduction (hereinafter sometimes simply called conduction) to the external electrode. In operation, a voltage is applied across the internal electrode layer, causing the piezoelectric layer to deform.

Such a stacked piezoelectric element is driven for use under severe conditions over a long period of time. There has therefore been the problem that the conductive adhesive may delaminate from the side face of the ceramic stack due to the stress, etc., caused by the deformation of the piezoelectric layer during operation. This has led to the possibility of a contact failure occurring between the internal electrode layer and the conductive adhesive, resulting in conduction failure. Furthermore, as the area of the end face of the internal electrode layer exposed in the side face of the ceramic stack is small, the possibility of the above failure dramatically increases in the event of delamination of the conductive adhesive.

To solve the above problem, various methods have been proposed to ensure good conduction between the internal electrode layer and the conductive adhesive.

For example, in Patent Document 1, a method is proposed that increases the area of the end face by shot blasting the side face of the stack block thereby causing the end of the internal electrode to protrude from the side face of the stack.

This method, however, involves manufacturing problems such as a difficult in quality control during volume production and the need for masking portions where shot blasting is not to be applied.

On the other hand, Patent Documents 2 and 3 each propose a method that forms an electrically conductive raised portion on the end of the internal electrode by metal plating. Further, Patent Documents 4 and 5 each propose a method that provides an electrically conductive protruding terminal on the end of the internal electrode.

However, with any of the above methods, the area of the end face of the internal electrode is nevertheless small, and there still exists the possibility that the conductive adhesive may delaminate, because the adhesive deteriorates and the adhesion drops as the piezoelectric layer is repeatedly stressed due to deformation and heat expansion during driving. Accordingly, it is difficult to solve the conduction failure problem.

The present invention has been devised in view of the above problem, and it is an object of the invention to provide a stacked piezoelectric element that has excellent durability and reliability by ensuring reliable electrical conduction between the internal electrode layer and the conductive adhesive, and a method of fabricating such a stacked piezoelectric element.

SUMMARY OF THE INVENTION

A first aspect of the present invention provides a stacked piezoelectric element comprising: a ceramic stack constructed by alternately stacking a piezoelectric layer made of a piezoelectric material and an internal electrode layer having electrical conductivity; and an external electrode bonded to side faces of said ceramic stack via an electrically conductive adhesive, wherein said each side face of said ceramic stack is provided with an electrode recess formed by indenting a portion of an edge of said internal electrode layer in a stacking direction thereof thereby forming a gap between said portion of an edge of said internal electrode layer and said piezoelectric layer, and said electrically conductive adhesive is applied so as to enter said electrode recess.

In the stacked piezoelectric element of this invention, the side face of the ceramic stack is provided with the electrode recess that is formed by indenting a portion of the edge of the internal electrode layer in the stacking direction thereof thereby forming a gap between said portion of an edge of said internal electrode layer and said piezoelectric layer. Then, the electrically conductive adhesive is applied so as to enter the electrode recess.

That is, by forming the electrode recess as described above, not only is the end face of the internal electrode layer exposed in the side face of the ceramic stack, but also a portion of the surface of the internal electrode layer is exposed inside the electrode recess. As a result, the applied conductive adhesive is in contact with the internal electrode layer not only in the side face but also in the electrode recess. In this way, the contact area between the conductive adhesive and the internal electrode layer is increased compared with that in the prior known structure, ensuring reliable conductance between the internal electrode layer and the conductive adhesive.

Further, as the conductive adhesive is applied so as to enter the gap formed by the electrode recess, its anchoring effect is enhanced, which serves to improve the adhesion between the side face and the conductive adhesive. Therefore, the conductive adhesive has a bonding strength that can withstand the stress caused by the deformation, etc., of the piezoelectric layer during operation, and the conductive adhesive does not easily delaminate. Delamination of the conductive adhesive can thus be suppressed.

In this way, in the above-stacked piezoelectric element, not only can reliable conduction be secured between the internal electrode layer and the conductive adhesive, but delamination of the conductive adhesive can also be suppressed. This ensures high reliability and sufficient durability over an extended period of time.

As described above, according to this invention, a stacked piezoelectric element can be provided that has excellent durability and reliability by ensuring reliable electrical conduction between the internal electrode layer and the conductive adhesive.

A second aspect of the present invention provides a method of fabricating a stacked piezoelectric element comprising: a ceramic stack constructed by alternately stacking a piezoelectric layer made of a piezoelectric material and an internal electrode layer having electrical conductivity; and an external electrode bonded to side faces of said ceramic stack via an electrically conductive adhesive, wherein said method includes:

a sheet forming step for forming a green sheet from which said piezoelectric layer is formed;

a printing step for printing on said green sheet an electrode material from which to form said internal electrode layer;

a recessed portion forming step for forming a recessed portion by pressing a portion of an edge of said electrode material from above thereby indenting said portion of said edge of said electrode material and said green sheet thereunder in a thickness direction thereof;

an intermediate stack forming step for forming an intermediate stack by cutting said green sheet into sheet pieces and stacking said sheet pieces, and for forming an electrode recess by exposing said recessed portion in said side face and thus forming a gap between said portion of said edge of said electrode material and said green sheet stacked thereover;

a calcining step for forming said ceramic stack by calcining said intermediate stack; and an electrode bonding step for applying said electrically conductive adhesive over said side faces and bonding said external electrode to said side face.

In the stacked piezoelectric element fabrication method of this invention, the recessed portion is formed in the recessed portion forming step by pressing a portion of the edge of the electrode material from above thereby indenting the portion of the edge of the electrode material and the green sheet thereunder in the thickness direction thereof. Then, in the intermediate stack forming step, the intermediate stack is formed by cutting the green sheet into sheet pieces and stacking the sheet pieces, and the electrode recess is formed by exposing the recessed portion in the side face and thus forming a gap between the portion of the edge of the electrode material and the green sheet stacked thereover.

That is, using the recessed portion formed in the recessed portion forming step as described above, in the intermediate stack forming step, an electrode recess is formed that provides a gap between the portion of the edge of the electrode material and the green sheet stacked thereover. The electrode recess remains formed in the side face of the ceramic stack even after the calcining step. At this time, the internal electrode layer formed from the electrode material is not only exposed at its end face to the side face, but also a portion of the surface of the internal electrode layer is exposed inside the electrode recess. As a result, the conductive adhesive applied over the side face in the electrode bonding step is in contact with the internal electrode layer not only in the side face but also in the electrode recess. In this way, the contact area between the conductive adhesive and the internal electrode layer is increased compared with that in the prior known structure, ensuring reliable conductance between the internal electrode layer and the conductive adhesive.

Further, as the conductive adhesive applied over the side face in the electrode bonding step is made to enter the gap, its anchoring effect is enhanced, which serves to improve the adhesion between the side face and the conductive adhesive.

Therefore, the conductive adhesive has a bonding strength that can withstand the stress caused by the deformation, etc. of the piezoelectric layer during operation, and the conductive adhesive does not easily delaminate. Delamination of the conductive adhesive can thus be suppressed.

In this way, in the stacked piezoelectric element fabricated in accordance with the above fabrication method, not only can reliable conduction be secured between the internal electrode layer and the conductive adhesive, but delamination of the conductive adhesive can also be suppressed. This ensures high reliability and sufficient durability over an extended period of time.

As described above, according to this invention, a fabrication method can be provided for fabricating a stacked piezoelectric element that has excellent durability and reliability by ensuring reliable electrical conduction between the internal electrode layer and the conductive adhesive.

DETAILED DESCRIPTION

Figure 1:
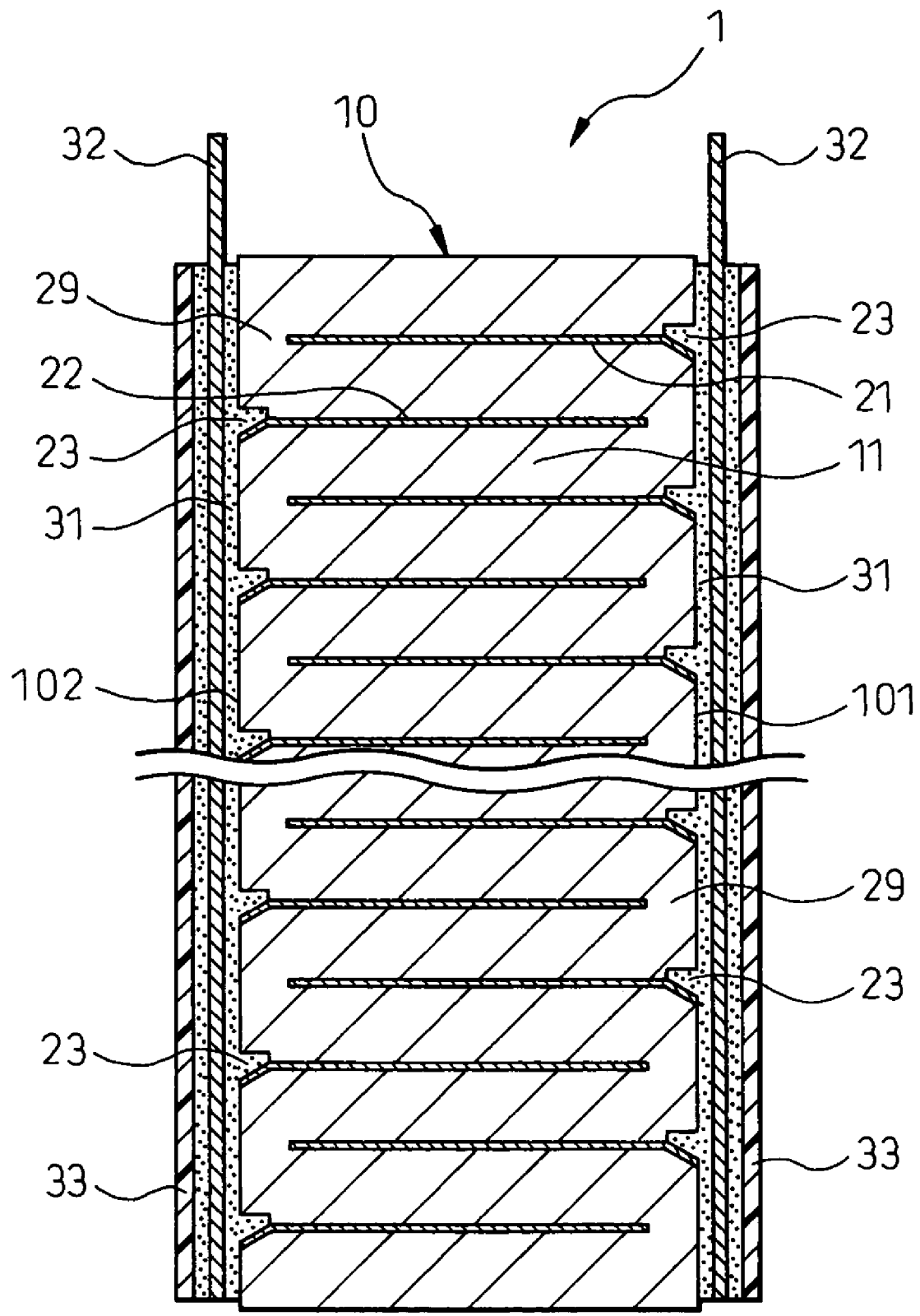
FIG. 1 is an explanatory diagram showing the structure of a stacked piezoelectric element according to Example 1.

Preferably, in the first aspect of the invention, the portion of the internal electrode layer that is exposed in the electrode recess is sloped at an angle relative to the plane orthogonal to the stacking direction.

This configuration makes it easier for the conductive adhesive entering the electrode recess to contact the internal electrode layer.

Further preferably, the ceramic stack has an electrode tucking structure in which at least a portion of the edge of the internal electrode layer is tucked inside the ceramic stack and not exposed outside thereof, and an outer circumferential surface of the ceramic stack is provided with a slit in the form of a groove elongated circumferentially and recessed from the outer circumferential surface into the piezoelectric layer.

In this configuration, the electrode tucking structure incorporated in the ceramic stack ensures electrical insulation in the area where the edge portion of the internal electrode layer is tucked.

Furthermore, the slit provided in the stacked piezoelectric element acts to relieve the stress caused by the deformation of the piezoelectric layer during driving. This prevents the delamination of the conductive adhesive, the delamination/cracking of the piezoelectric layer, etc. and serves to improve the durability of the stacked piezoelectric element as a whole.

Preferably, in the second aspect of the invention, in the printing step, the electrode material is printed on the green sheet and, adjacent to the electrode material and on a portion where the electrode tucking portion is to be formed, a spacer layer is printed to substantially the same thickness as the electrode material.

In this configuration, as the electrode material and the spacer layer are printed to substantially the same thickness, no step is formed between their printed surfaces. As a result, not only can the cut sheet pieces be stacked with high accuracy, but the intermediate stack constructed by stacking the sheet pieces need not be compressed by applying a high pressure in order to flatten the step that would otherwise be formed between the printed surfaces.

Further preferably, in the printing step, a dissipating slit layer which is subsequently caused to dissipate in the calcining step is printed on the green sheet and, adjacent to the dissipating slit layer, a spacer layer which is to be left unremoved when calcined is printed to substantially the same thickness as the dissipating slit layer, in the intermediate stack forming step, an electrode-containing piece, which comprises the electrode material applied on the green sheet and the recessed portion formed thereon, and a dissipating-slit-layer-containing pieces, which comprises the dissipating slit layer and the spacer layer formed on the green sheet, are fabricated and stacked together, and in the calcining step, a slit in the form of a groove recessed from an outer circumferential surface of the ceramic stack into the piezoelectric layer is formed by causing the dissipating slit layer to dissipate.

In this configuration, as the dissipating slit layer and the spacer layer printed to substantially the same thickness, no step is formed between their printed surfaces. As a result, not only can the electrode-containing and dissipating-slit-layer-containing pieces be stacked with high accuracy, but the intermediate stack constructed by stacking these sheet pieces need not be compressed by applying a high pressure in order to flatten the step that would otherwise be formed between the printed surfaces.

Furthermore, in the stacked piezoelectric element fabricated using the above ceramic stack, the slit formed in the ceramic stack acts to relieve the stress caused by the deformation of the piezoelectric layer during driving. This prevents the delamination of the conductive adhesive, the delamination/cracking of the piezoelectric layer, etc. and serves to improve the durability of the stacked piezoelectric element as a whole.

Preferably, after the recessed portion forming step, an adhesive layer which exerts a bonding function is printed over an upper surface of the electrode material except where the recessed portion is formed.

In this configuration, since the sheet pieces can be stacked while bonding them together by the bonding function of the adhesive layer, the stacked sheet pieces can be held together firmly.

In the second aspect of the present invention, the spacer layer and the adhesive layer are formed from a material that can provide electrical insulation. Specifically, it is preferable to use the same material as that used for forming the piezoelectric layer.

EXAMPLE

Example 1

A stacked piezoelectric element and a method of fabrication thereof according to an example of the present invention will be described with reference to FIGS. 1 to 14.

Figure 2:
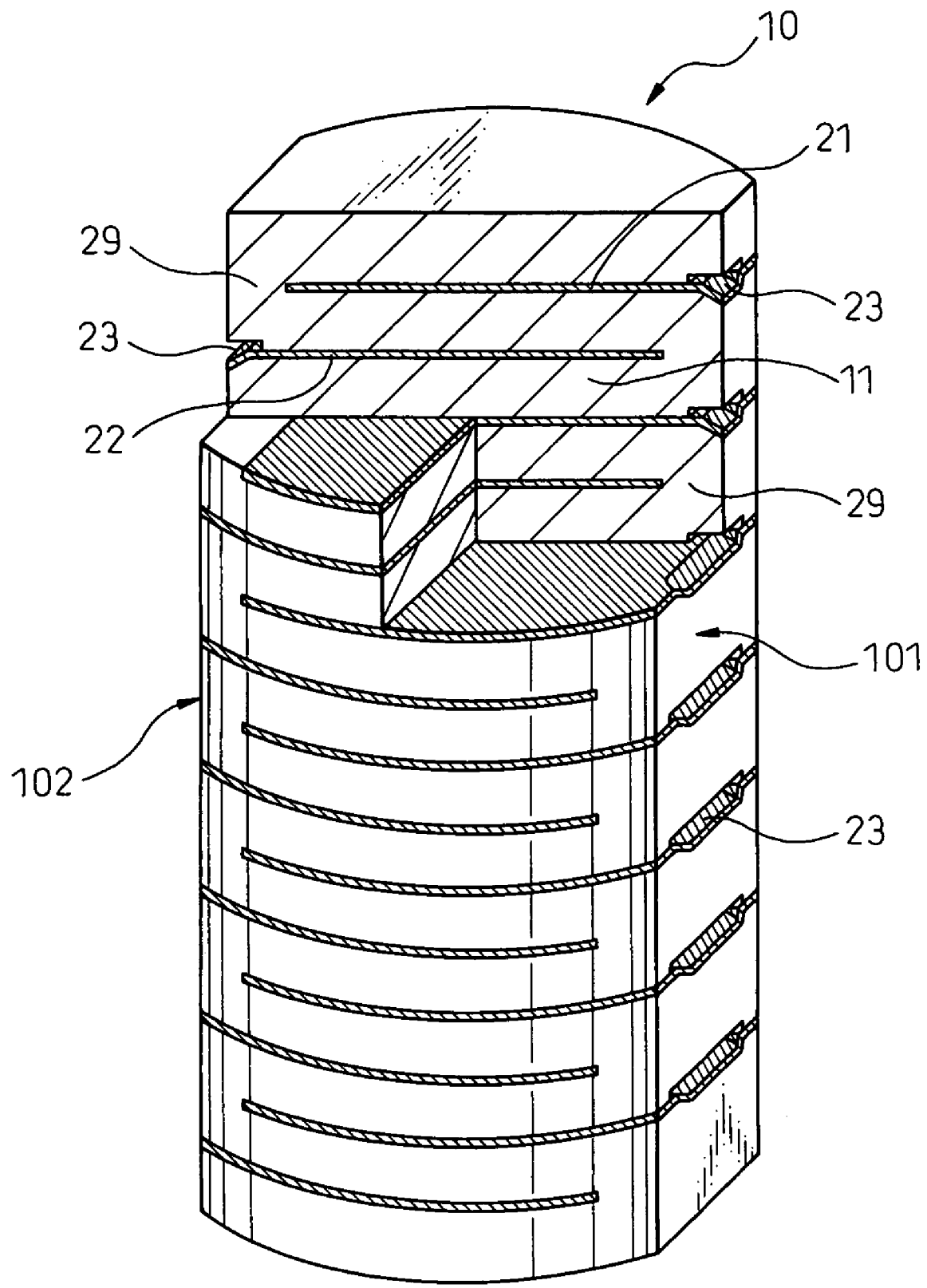
FIG. 2 is a perspective view showing the structure of a ceramic stack according to Example 1.

As shown in FIGS. 1 and 2, the stacked piezoelectric element 1 according to this embodiment comprises: a ceramic stack 10 constructed by alternately stacking piezoelectric layers 11 made of a piezoelectric material and internal electrode layers 21, 22 having electrical conductivity; and external electrodes 32 bonded to the side faces 101 and 102 of the ceramic stack 10 via an electrically conductive adhesive 31.

The side faces 101 and 102 of the ceramic stack 10 are provided with electrode recesses 23 each formed by indenting a portion of the edge of each of the internal electrode layers 21, 22 in the stacking direction thereof thereby forming a gap between it and the overlying piezoelectric layer 11, and the conductive adhesive 31 is applied so as to enter the electrode recesses 23 from the side faces 101 and 102 of the ceramic stack 10.

The structure will be described in detail below.

In the stacked piezoelectric element 1 of this example, the ceramic stack 10 has a barrel-shaped cross section, as shown in FIG. 2, with the pair of opposite side faces 101 and 102 formed on the outer circumferential surface of the stack which is generally cylindrical in shape. The cross-sectional shape of the ceramic stack 10 is not limited to the barrel shape shown in this example, but various other shapes, such as a circular shape, rectangular shape, or an octagonal shape, may be chosen according to the purpose and conditions of use.

Further, as shown in FIGS. 1 and 2, the ceramic stack 10 has an electrode tucking structure in which a portion of the edge of each of the internal electrode layers 21, 22 is not exposed in the outer circumferential surface of the ceramic stack 10 but is tucked inside. More specifically, in this example, in the side face 101 of the ceramic stack 10, the edge of the first internal electrode layer 21 is exposed, but the edge of the second internal electrode layer 22 is tucked inside the ceramic stack 10 by providing an electrode tucking portion 29. On the other hand, in the side face 102, the edge of the second internal electrode layer 22 is exposed, but the edge of the first internal electrode layer 21 is tucked inside the ceramic stack 10 by providing an electrode tucking portion 29. Each electrode tucking portion 29 provides physical separation to ensure electrical insulation for that portion. The first internal electrode layer 21 and the second internal electrode layer 22 are arranged in alternating fashion across the stacking direction.

The internal electrode layers 21 and 22 are formed from an Ag/Pd alloy.

Further, as shown in FIGS. 1 and 2, the side faces 101 and 102 of the ceramic stack 10 are provided with the electrode recesses 23 each formed by indenting a portion of the edge of each of the internal electrode layers 21, 22 in the stacking direction thereof thereby forming a gap between it and the overlying piezoelectric layer 11. Then, the conductive adhesive 31 is applied so as to enter the electrode recesses 23 from the side faces 101 and 102 of the ceramic stack 10 and contact the edges of the internal electrode layers 21, 22 exposed in the respective electrode recesses 23. The entire circumference of the ceramic stack 10 is covered with a molding material 33 made of an insulating resin.

Here, the external electrodes may be bonded only to the uppermost portions of the respective side faces 101 and 102 of the ceramic stack 10. The conductive adhesive 31 comprises an epoxy resin and Ag. The molding material 33 is made of a silicone resin.

Next, the fabrication method of the stacked piezoelectric element 1 according to this example will be described.

The fabrication method of the stacked piezoelectric element 1 according to this example includes at least a sheet forming step, a printing step, a recessed portion forming step, an intermediate stack forming step, a calcining step, and an electrode bonding step.

In the sheet forming step, a green sheet 110 from which to form the piezoelectric layers 11 is formed.

In the printing step, an electrode material 200 for forming the internal electrode layers 21 and 22 is printed on the green sheet 110.

In the recessed portion forming step, a recessed portion 230 is formed by pressing a portion of the edge of the electrode material 200 from above thereby indenting the portion of the edge of the electrode material 200 and the underlying green sheet 110 in the thickness direction.

In the intermediate stack forming step, an intermediate stack 100 is formed by cutting the green sheet 110 into sheet pieces and stacking the sheet pieces together, and an electrode recess 23 is formed by exposing the recessed portion 230 in the side face and thus forming a gap between the portion of the edge of the electrode material 200 and the overlying green sheet 110.

In the calcining step, the ceramic stack 10 is formed by calcining the intermediate stack 100.

In the electrode bonding step, the conductive adhesive 31 is applied over the side faces 101 and 102 of the ceramic stack 10, and the external electrodes 32 are bonded to the respective side faces.

The fabrication method will be described in detail below.

<Green Sheet Fabrication Step>

First, as a piezoelectric material, a ceramic material powder such as lead zirconate titanate (PZT) is prepared, and calcined at 800 to 950° C. Next, pure water and a dispersing agent are added to the calcined powder to form slurry, which is then wet-ground using a pearl mill. The thus ground slurry is dried and degreased, and then a solvent, a binder, a plasticizer, a dispersing agent, etc. are added to it and mixed together by using a ball mill; thereafter, the resulting slurry is vacuum degassed by agitating it using an agitator in a vacuum chamber, and is adjusted for viscosity.

Figure 3:
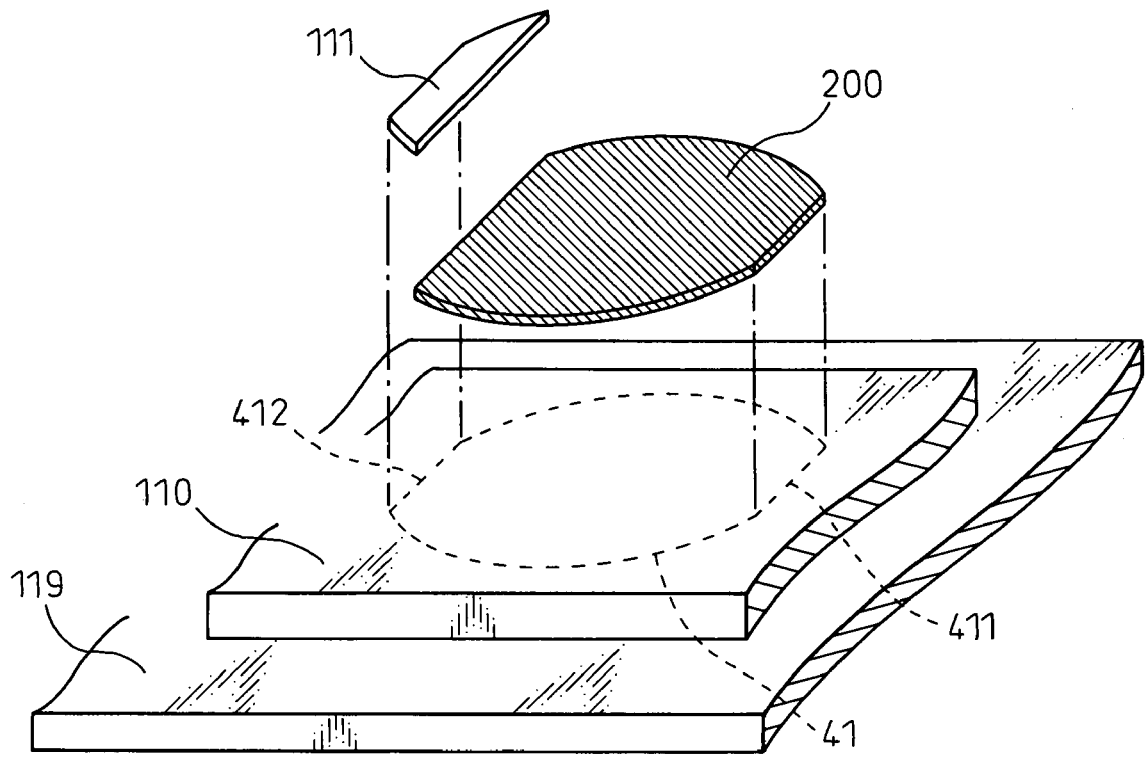
FIG. 3 is an explanatory diagram illustrating a printing step according to Example 1.

Then, the slurry is applied over a carrier film 119 by a doctor blade method, thus forming a long green sheet 110 with a thickness of 90 μm (see FIG. 3).

Other than the doctor blade method used in this example, various methods such as extrusion molding can be used for the formation of the green sheet 110.

<Printing Step>

Next, as shown in FIG. 3, the electrode material 200 is printed on a portion where the internal electrode layer 21, 22 is to be formed, within a punching area 41 defined on the green sheet 110. Then, on a portion within the punching area 41 where the electrode material 200 is not printed, that is, the portion where the electrode tucking portion 29 is to be formed, a spacer layer 111 made of the same slurry as that used for forming the green sheet 110 is printed to the same thickness as the electrode material 200 in order to make the portion not printed with the electrode material 200 substantially flush with the portion printed with the electrode material 200. In this example, of two straight line portions 411 and 412 of the punching area 41, the spacer layer 111 has been printed on an outer circumferential segment containing the straight line portion 412.

In this example, an Ag/Pd alloy in a paste form has been used as the electrode material 200. Instead, use may be made of an elemental metal such as Ag, Pd, Cu, or Ni or an alloy such as Cu/Ni.

<Recessed Portion Forming Step>

Figure 4:
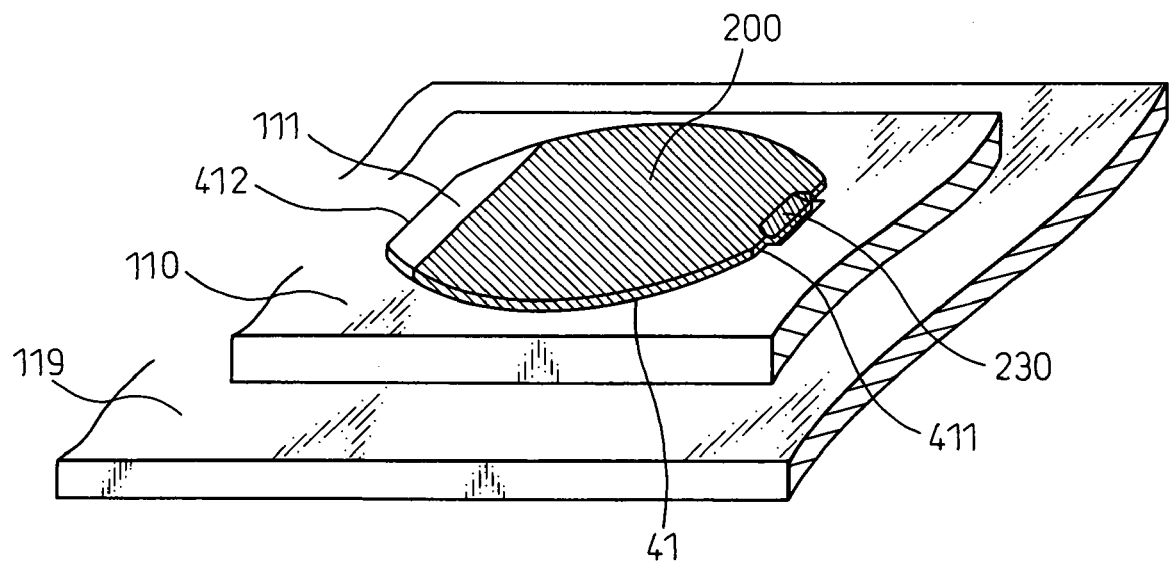
FIG. 4 is an explanatory diagram illustrating a recessed portion forming step according to Example 1.
Figure 5:
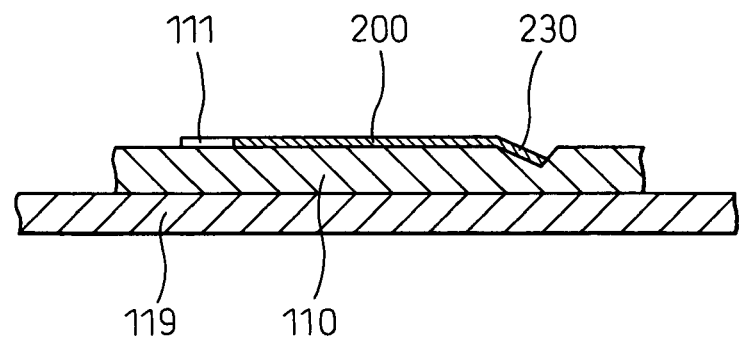
FIG. 5 is a cross-sectional view of a green sheet in which a recessed portion is formed according to Example 1.

Next, as shown in FIGS. 4 and 5, in the electrode material 200 printed within the punching area 41, a portion of an outer circumferential segment containing the straight line portion 411 is pressed from above by a molding press, thereby indenting that portion of the electrode material 20 and the underlying green sheet 110 in the thickness direction to form the recessed portion 230.

Figure 6:
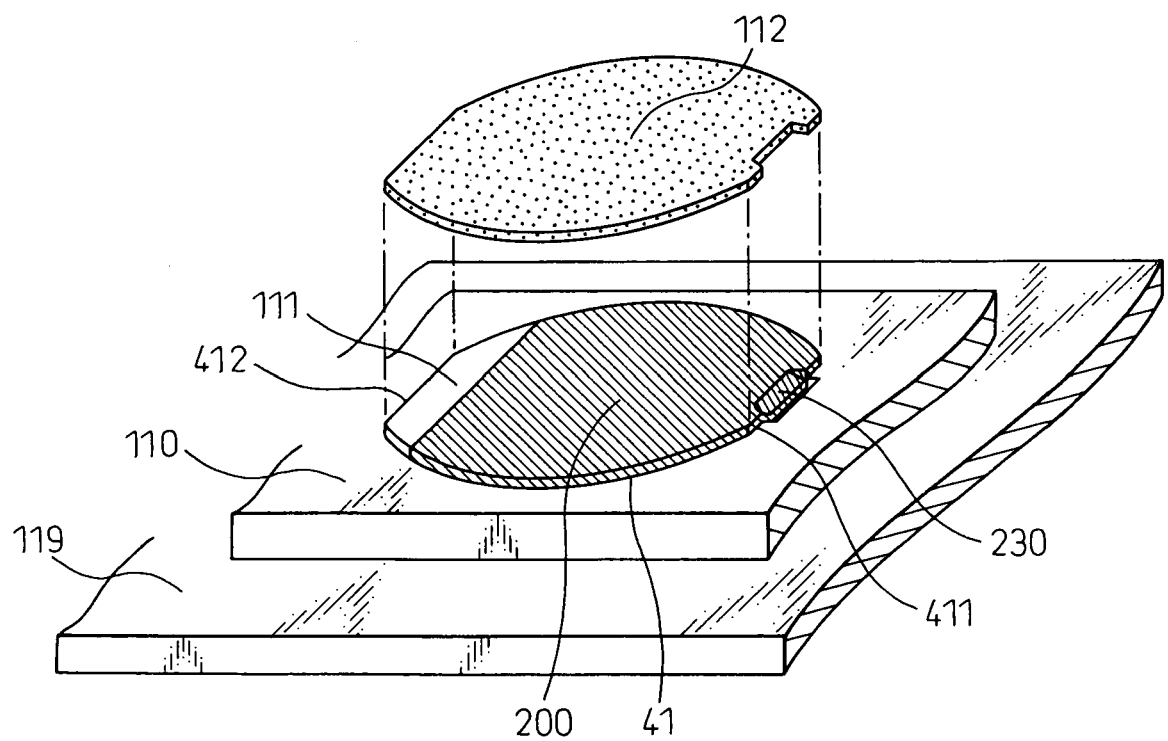
FIG. 6 is an explanatory diagram illustrating an adhesive layer printing step according to Example 1.

Then, in this example, an adhesive layer 112 made of the above slurry is printed over the electrode material 200 and the spacer layer 111, as shown in FIG. 6, in order to enhance adhesion when stacking the punched out sheet pieces as will be described later. At this time, the adhesive layer 112 is printed over the entire portion of the electrode material 200 except the recessed portion 230 thereof.

In this example, in order to enhance the efficiency with which a punching/stacking device to be described later punches the sheet and stacks the punched out sheet pieces, the printing step is performed by progressing in the longitudinal direction of the long green sheet 110 in the order in which the punched out sheet pieces are to be stacked. After that, the recessed portion forming step and the printing of the adhesive layer 112 are performed.

Figure 7:
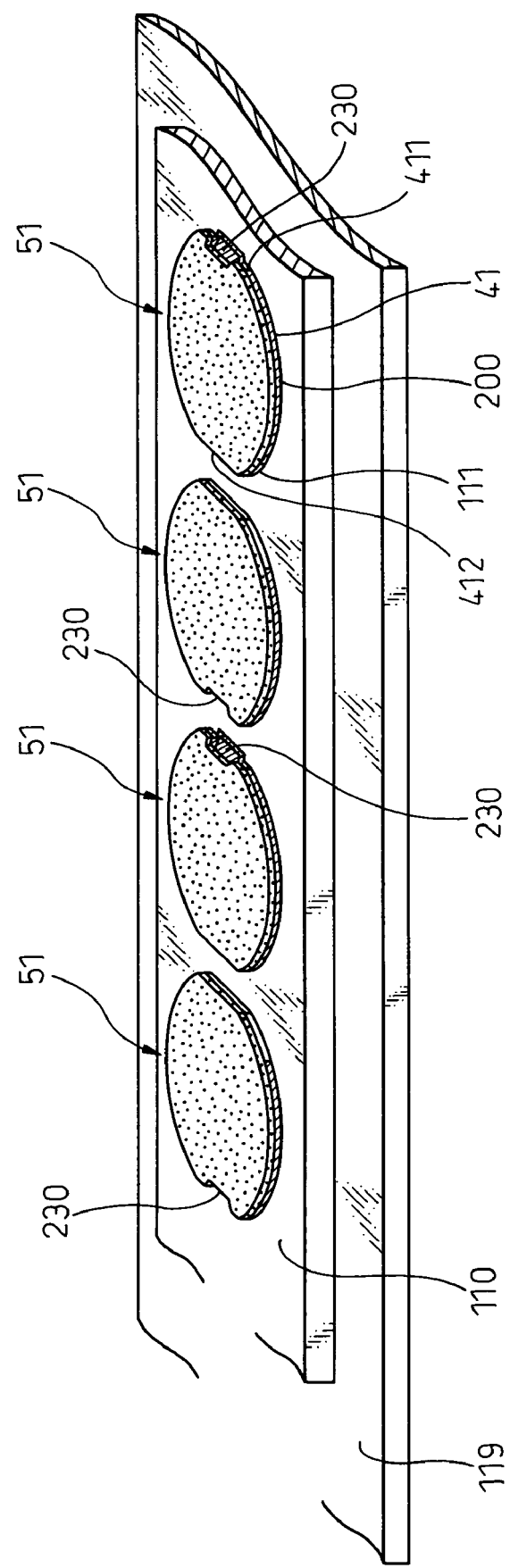
FIG. 7 is an explanatory diagram showing a long green sheet which is to be punched out and stacked according to Example 1.

More specifically, as shown in FIG. 7, the printing positions of the electrode material 200 and the spacer layer 112 are reversed from one punching area 41 to the next along the longitudinal direction of the green sheet 110. Accordingly, the recessed portion 230 is formed alternately on either side of the punching area 41, that is, on the straight line portion 411 side in one punching area and on the straight line portion 412 side in the next punching area. Then, electrode-containing pieces 51 can be obtained by punching out the respective punching areas 41.

<Intermediate Stack Forming Step>

Next, using the punching/stacking device (not shown) that is designed to perform the punching of the sheet and the stacking of the sheet pieces at the same time, the punching of the punching areas 41 in the green sheet 110 and the stacking of the electrode-containing pieces 51 thus punched out are carried out concurrently.

Figure 8:
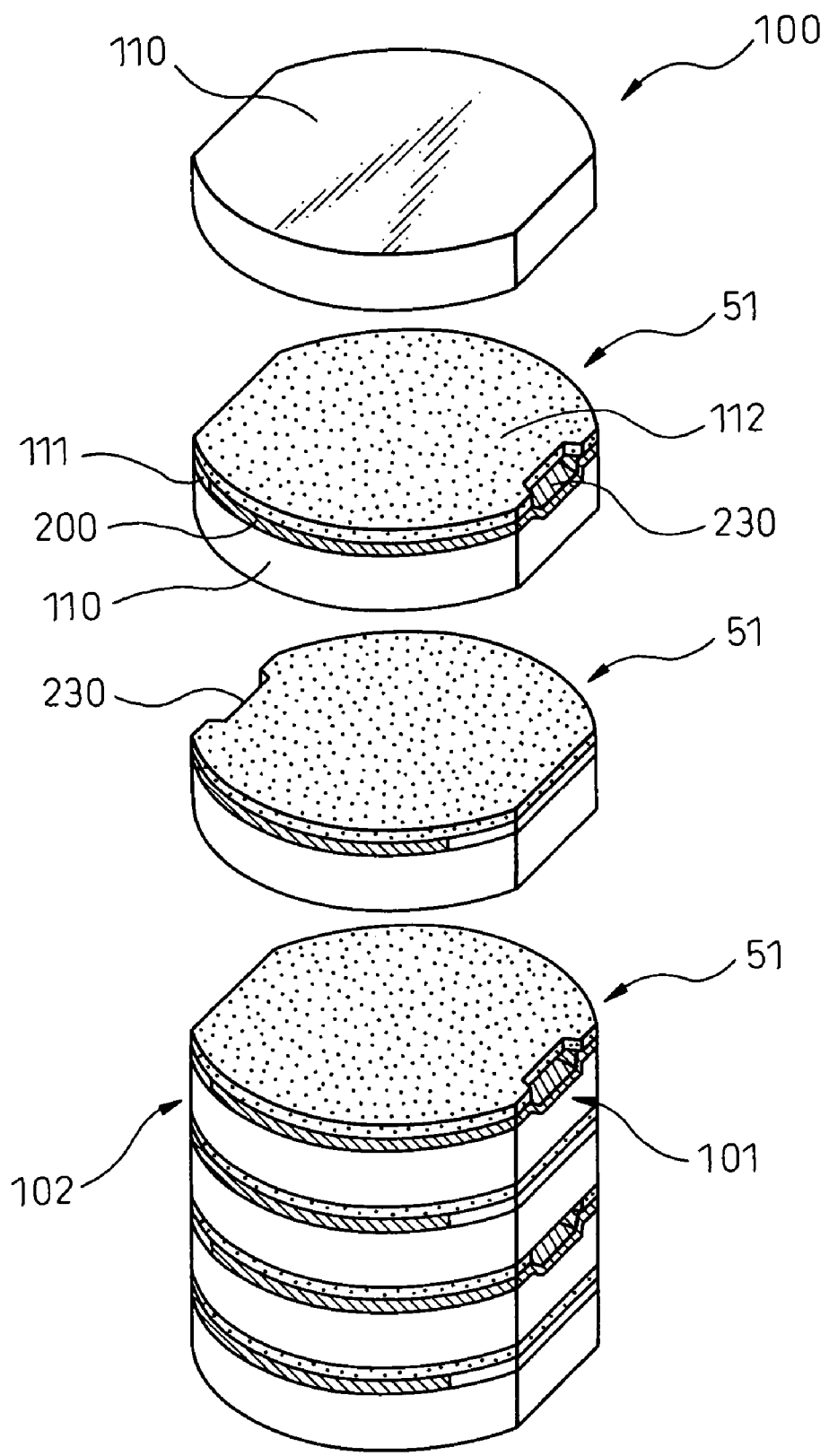
FIG. 8 is an explanatory diagram illustrating an intermediate stack forming step according to Example 1.

First, the carrier film 119 and the green sheet 110 are held together and set in the punching/stacking device, and the electrode-containing pieces 51 are obtained by punching out the punching areas 41. Then, the intermediate stack 100 is constructed by stacking the electrode-containing pieces 51 one on top of another as shown in FIG. 8. At this time, the recessed portions 230 are exposed in the side faces 101 and 102. An unprinted green sheet 110 is placed on the top of the stack.

Figure 9:
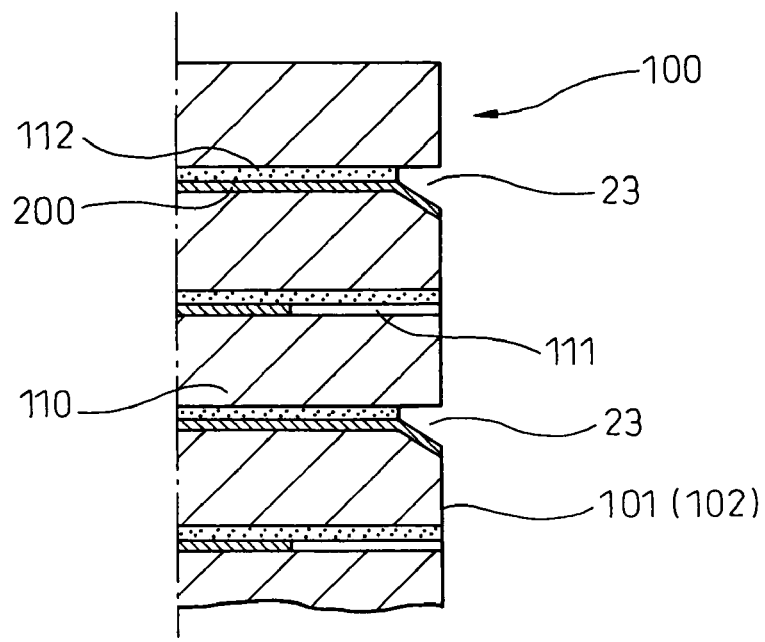
FIG. 9 is a cross-sectional view showing the structure in the vicinity of an electrode recess after the intermediate stack forming step according to Example 1.

Thus, the electrode recesses 23, each forming a gap between a portion of the edge of the electrode material 200 and the overlying green sheet 110, are formed in the side faces 101 and 102 of the intermediate stack 100, as shown in FIG. 9.

Then, the intermediate stack 100 is held together by applying pressure in the stacking direction.

In this example, as the spacer layer 111 is printed to eliminate the step on the printed surface, the punched out electrode-containing pieces 51 can be stacked with high accuracy. Further, as the adhesive layer 112 is printed, the punched out electrode-containing pieces 51 can be stacked while bonding them together. Therefore, the intermediate stack 100 constructed by stacking the electrode-containing pieces 51 need not be compressed firmly.

<Calcining Step>

Next, the intermediate stack 100 is degreased by heating. For heating, the temperature is gradually raised up to 500° C. over a period of 80 hours; then, the stack is held at that temperature for five hours. In this process, more than 90% of the binder resin contained in the green sheet 110 is removed.

Next, the degreased intermediate stack 100 is calcined. For calcining, the temperature is gradually raised up to 1065° C. over a period of 12 hours, and the stack is then held at that temperature for two hours and thereafter gradually cooled in the furnace. The result is the formation of the ceramic stack 10 comprising the internal electrode layers 21 and 22 interleaved between the piezoelectric layers 11 as shown in FIG. 10.

Figure 10:
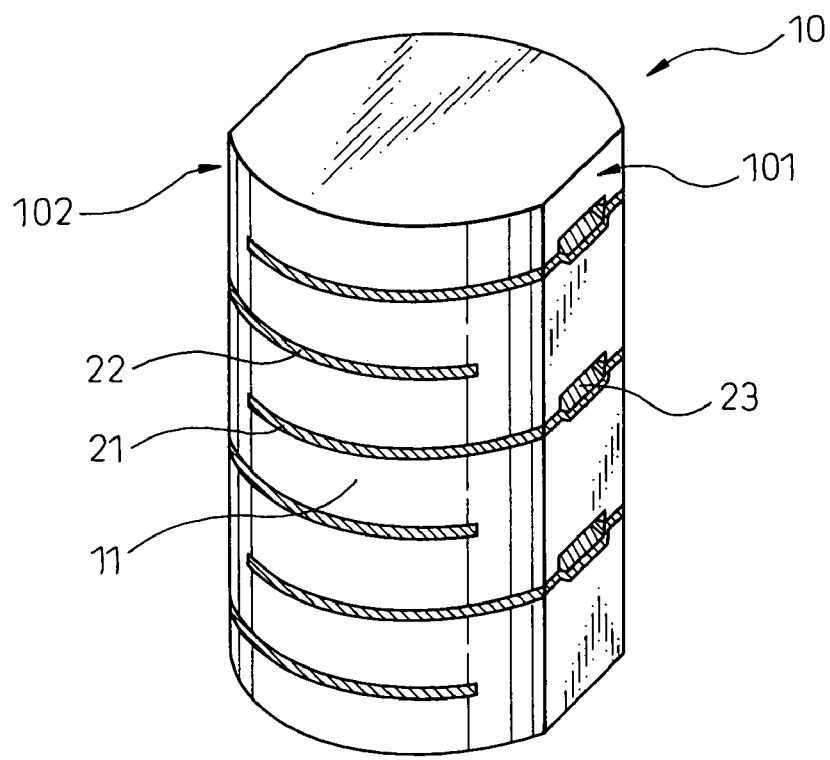
FIG. 10 is an explanatory diagram showing a ceramic stack after a calcining step according to Example 1.
Figure 11:
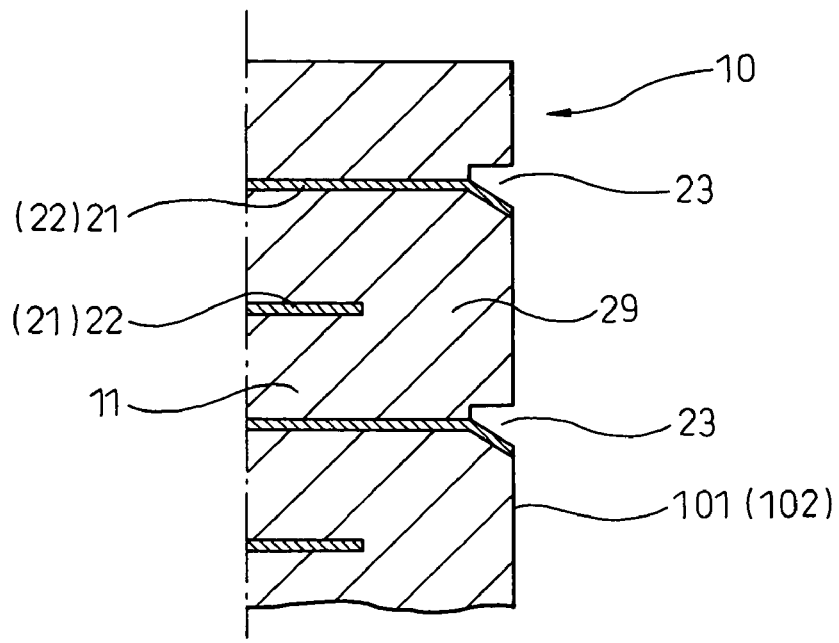
FIG. 11 is a cross-sectional view showing the structure in the vicinity of the electrode recess after the calcining step according to Example 1.

As a result of the calcination, the green sheet 110 forms the piezoelectric layers 11 in the ceramic stack 10, and the electrode material 200 forms the internal electrode layers 21 and 22, as shown in FIGS. 10 and 11. Further, the spacer layer 111 forms the electrode tucking portion 29, and the adhesive layer 112 forms a portion of the piezoelectric layer 11. The electrode recesses 23 are formed in the side faces 101 and 102 of the ceramic stack 10, with each recess maintaining a gap between a portion of the edge of each of the internal electrode layers 21, 22 and the overlying piezoelectric layer 11.

<Electrode Bonding Step>

Figure 12:
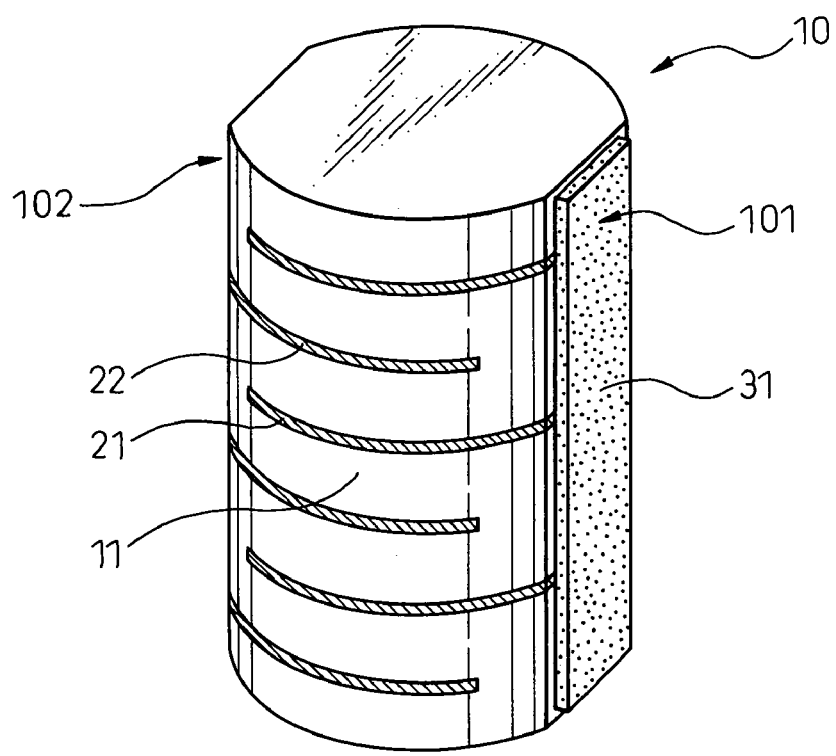
FIG. 12 is an explanatory diagram illustrating a conductive adhesive applying step according to Example 1.
Figure 13:
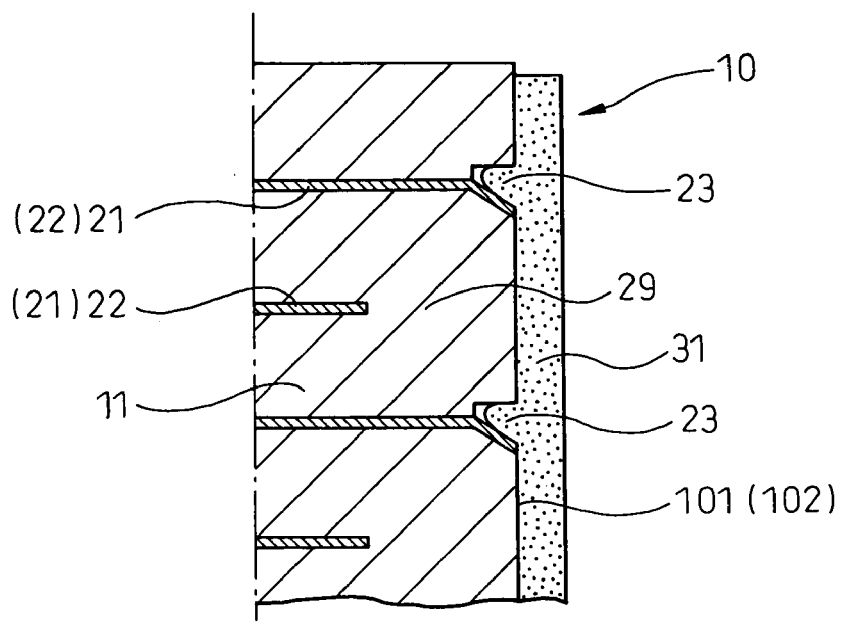
FIG. 13 is a cross-sectional view showing the structure in the vicinity of the electrode recess after the conductive adhesive applying step according to Example 1.

After the calcining step, the conductive adhesive 31 is applied over the side faces 101 and 102 of the ceramic stack 10, as shown in FIG. 12. At this time, the conductive adhesive 31 is applied so as to enter the electrode recesses 23 and contact the internal electrode layers 21, 22 exposed in the respective electrode recesses 23, as shown in FIG. 13.

Figure 14:
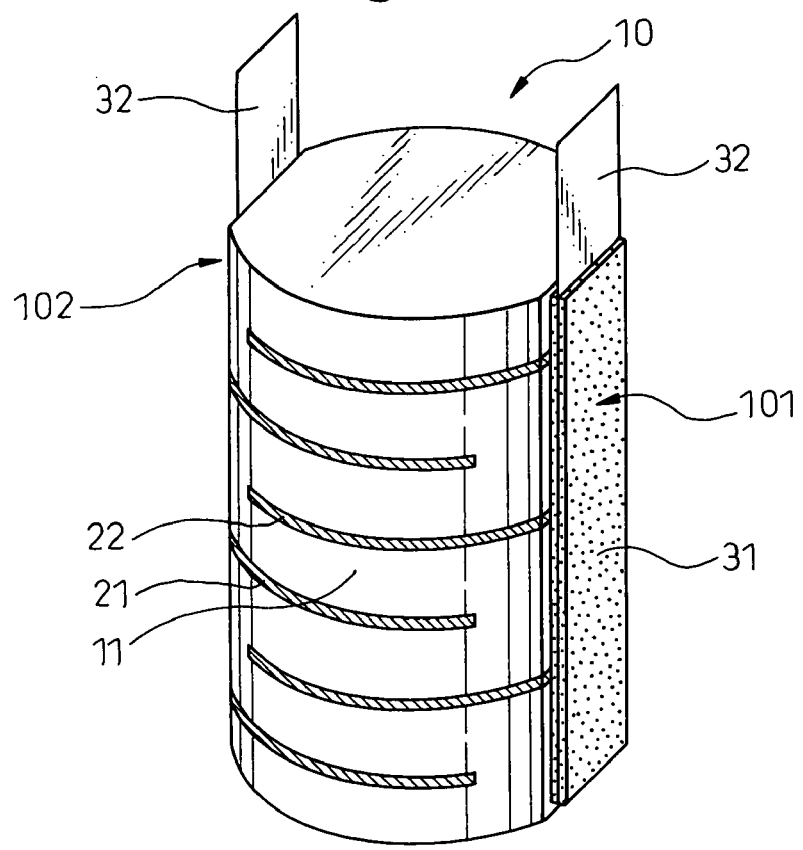
FIG. 14 is an explanatory diagram illustrating an external electrode bonding step according to Example 1.

Then, after placing the external electrodes 32 onto the conductive adhesive 31 as shown in FIG. 14, the conductive adhesive 31 is cured by heating, to bond the external electrodes 32 in place.

Finally, the entire circumference of the ceramic stack 10 is covered with the molding material 33 made of a silicone resin, i.e., an insulating resin, to complete the fabrication of the stacked piezoelectric element 1 shown in FIG. 1.

In this example, the conductive adhesive 31 had been prepared by dispersing Ag as a conductive filler through an epoxy resin used as an insulating resin. Here, various other resins, such as silicone, urethane, polyimide, etc. can be used as the insulating resin. Further, instead of Ag, other metals such as Cu, Ni, etc. can be used as the conductive filler.

The external electrodes 32 have each been constructed using a mesh-like expanded metal formed by working a metal plate. Instead, a punched metal may be used.

Next, the operation and effect of the stacked piezoelectric element 1 of this example and the method of fabrication thereof will be described. In the stacked piezoelectric element 1 of this example, the side faces 101 and 102 of the ceramic stack 10 are provided with the electrode recesses 23 each formed by indenting a portion of the edge of each of the internal electrode layers 21, 22 in the stacking direction thereby forming a gap between it and the overlying piezoelectric layer 11. Then, the conductive adhesive 31 is applied so as to enter the electrode recesses 23 from the side faces 101 and 102 of the ceramic stack 10.

That is, by forming the electrode recesses 23 as described above, not only are the end faces of the internal electrode layers 21, 22 exposed in the side faces 101 and 102 of the ceramic stack 10, but also a portion of the surface of each internal electrode layer is exposed inside the electrode recess 23. As a result, the applied conductive adhesive 31 is in contact with the internal electrode layers 21, 22 at not only the side faces 101 and 102 but also in the respective electrode recesses 23. In this way, the contact area between the conductive adhesive 31 and each of the internal electrode layers 21, 22 is increased compared with that in the prior known structure, ensuring reliable conductance between the conductive adhesive 31 and the internal electrode layers 21, 22.

Further, as the conductive adhesive 31 is applied so as to enter the gap formed by each electrode recess 23, its anchoring effect is enhanced, which serves to improve the adhesion between the conductive adhesive 31 and the side faces 101 and 102. Therefore, the conductive adhesive 31 has a bonding strength that can withstand the stress caused by the deformation, etc. of the piezoelectric layers 11 during operation, and the conductive adhesive 31 does not easily delaminate. Delamination of the conductive adhesive 31 can thus be suppressed.

In this way, in the stacked piezoelectric element 1, not only can reliable conduction be secured between the conductive adhesive 31 and the internal electrode layers 21, 22, but delamination of the conductive adhesive 31 can also be suppressed. This ensures high reliability and sufficient durability over an extended period of time.

Further, the portions of the internal electrode layers 21, 22 exposed in the respective electrode recesses 23 are sloped at an angle relative to the plane orthogonal to the stacking direction. This makes it easier for the conductive adhesive 31 entering the electrode recesses to contact the internal electrode layers.

In the fabrication method of this example, in the printing step, the electrode material 200 is printed on the green sheet 110 and, then, adjacent to the electrode material 200 and on the portion where the electrode tucking portion 29 is to be formed, the spacer layer 111 is printed to substantially the same thickness as the electrode material 200. This eliminates the formation of a step between the printed surfaces of the electrode material 200 and the spacer layer 111. As a result, not only can the electrode-containing pieces 51 be stacked with high accuracy, but the intermediate stack 100 constructed by stacking the electrode-containing pieces 51 need not be compressed by applying a high pressure in order to flatten the step that would otherwise be formed between the printed surfaces. Furthermore, as the electrode tucking portion 29 is formed in the portion where the spacer layer 111 is printed, the physical separation it provides ensures electrical insulation.

After the recessed portion forming step, the adhesive layer 112 that exerts its bonding function when stacking is printed over the electrode material 200 except the recessed portion 230 thereof. Since the electrode-containing pieces 51 can be stacked while bonding them together by the bonding function of the adhesive layer 112, the stacked electrode-containing pieces 51 can be held together firmly.

As described above, according to this example, a stacked piezoelectric element that has excellent durability and reliability by ensuring reliable electrical conduction between the conductive adhesive and the internal electrode layers, and a method of fabrication thereof can be provided.

Figure 15:
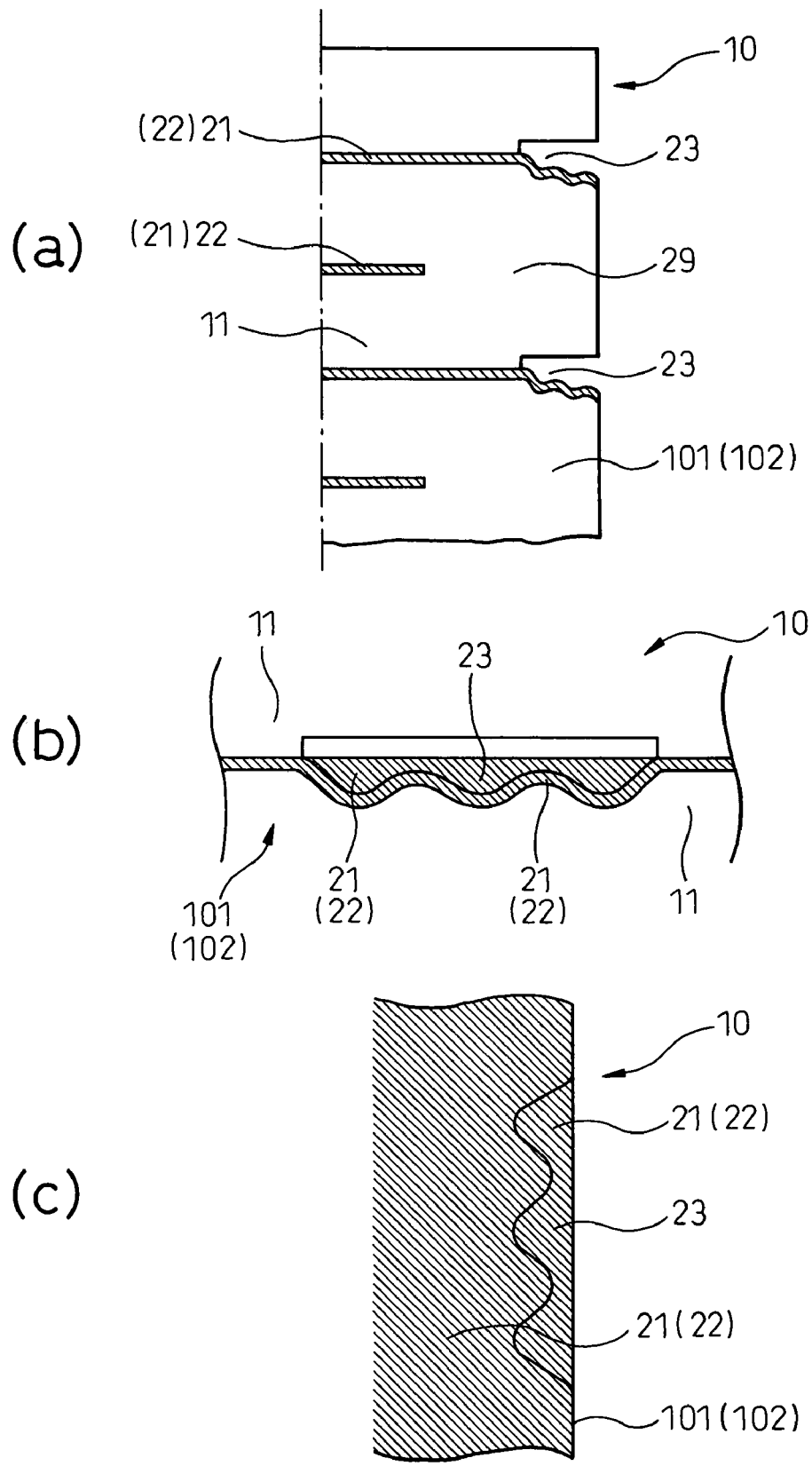
FIG. 15 is an explanatory diagram showing alternative shapes ((a) to (c)) of the electrode recess.

In this example, the portions of the internal electrode layers 21, 22 exposed in the respective electrode recesses 23 are sloped at an angle relative to the plane orthogonal to the stacking direction but, in addition to that, the sloped portions of the internal electrode layers 21, 22 may be formed in a corrugated shape as shown in FIG. 15(a). Further, the end faces of the internal electrode layers 21, 22 exposed in the side faces 101 and 102, as viewed from the front side, may be formed in a corrugated shape as shown in FIG. 15(b). Furthermore, when the stacking surfaces of the internal electrode layers 21, 22 are viewed from the stacking direction, the depths of the electrode recesses 23 as measured from the respective side faces 101 and 102 may not be made constant, but the electrode recesses 23 may each be formed, for example, in a corrugated shape as shown in FIG. 15(c). Further, these shapes may be combined as desired.

While the ceramic stack 10 has been described as incorporating an electrode tucking structure in which a portion of the edge of each of the internal electrode layers 21, 22 is not exposed but is tucked inside by forming the electrode tucking portion 29, it is also possible to employ a full electrode structure in which the entire edge of each of the internal electrode layers 21, 22 is exposed. In that case, in the printing step, there is no need to print the spacer layer 111, but only the electrode material 200 should be printed on the punching area 41.

Example 2

Figure 18:
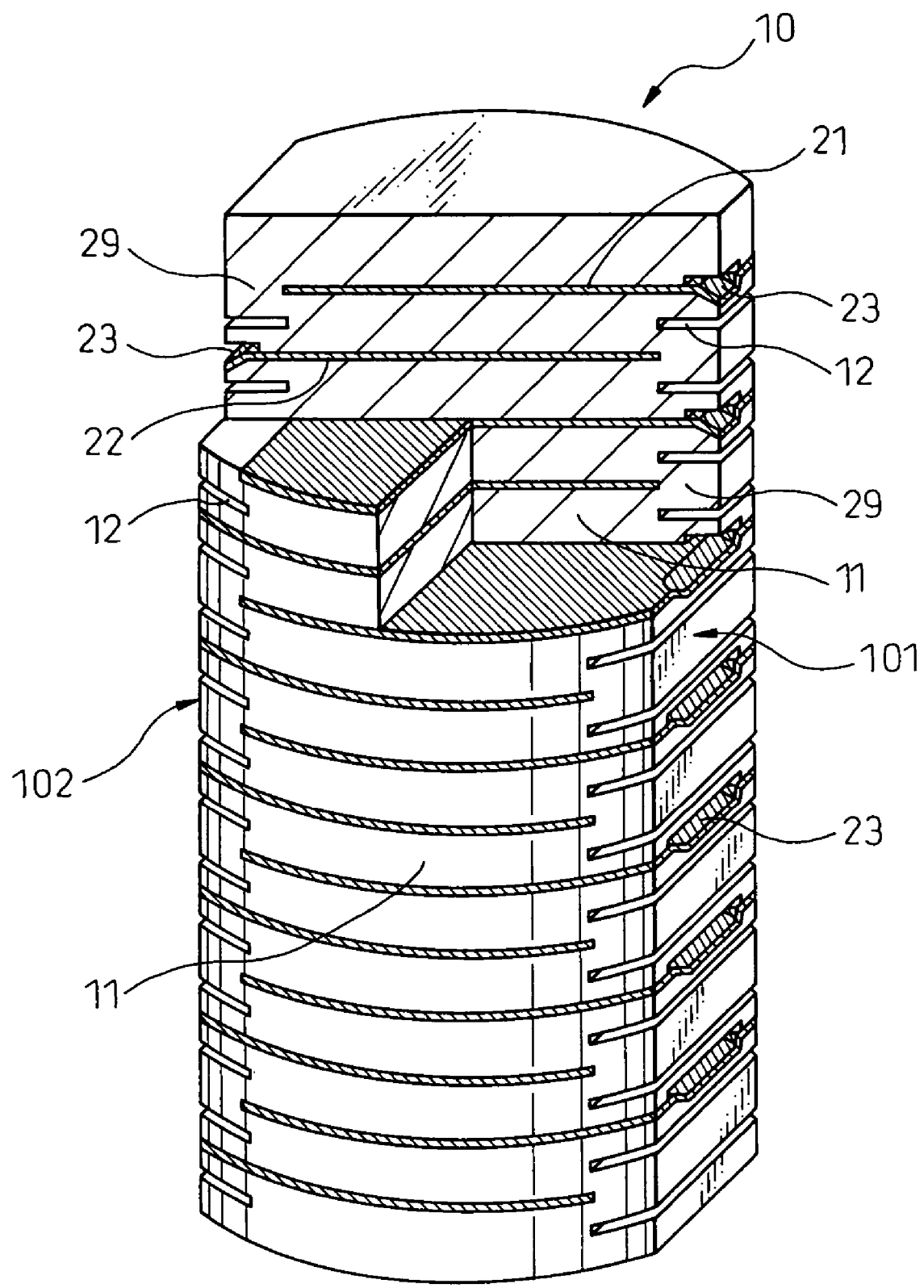
FIG. 18 is an explanatory diagram showing the structure of a ceramic stack formed with slits according to Example 2.

This example differs from the stacked piezoelectric element 1 of Example 1 in that slits 12 are formed in the outer circumferential surface of the ceramic stack 10, as shown in FIG. 18.

In the fabrication method of the stacked piezoelectric element 1 of this example, dissipating slit layers 120 which are subsequently caused to dissipate in the calcining step are printed on the green sheet 110 in the printing step and, adjacent to the dissipating slit layers 120, a spacer layer 111 that is to be left after calcining is printed to the same thickness as the dissipating slit layers 120.

Then, in the intermediate stack forming step, electrode-containing pieces 51, each comprising the electrode material 200 applied on the green sheet 110 and the recessed portion 230 formed thereon, and dissipating-slit-layer-containing pieces 52, each comprising the dissipating slit layers 120 and the spacer layers 111 formed on the green sheet 110, are fabricated and stacked together.

In the calcining step, the dissipating slit layers 120 are caused to dissipate, thus forming the slits 12 each in the form of a groove recessed into the piezoelectric layer 11 inwardly from the outer circumferential surface of the ceramic stack 10.

This fabrication method will be described in detail below.

Figure 16:
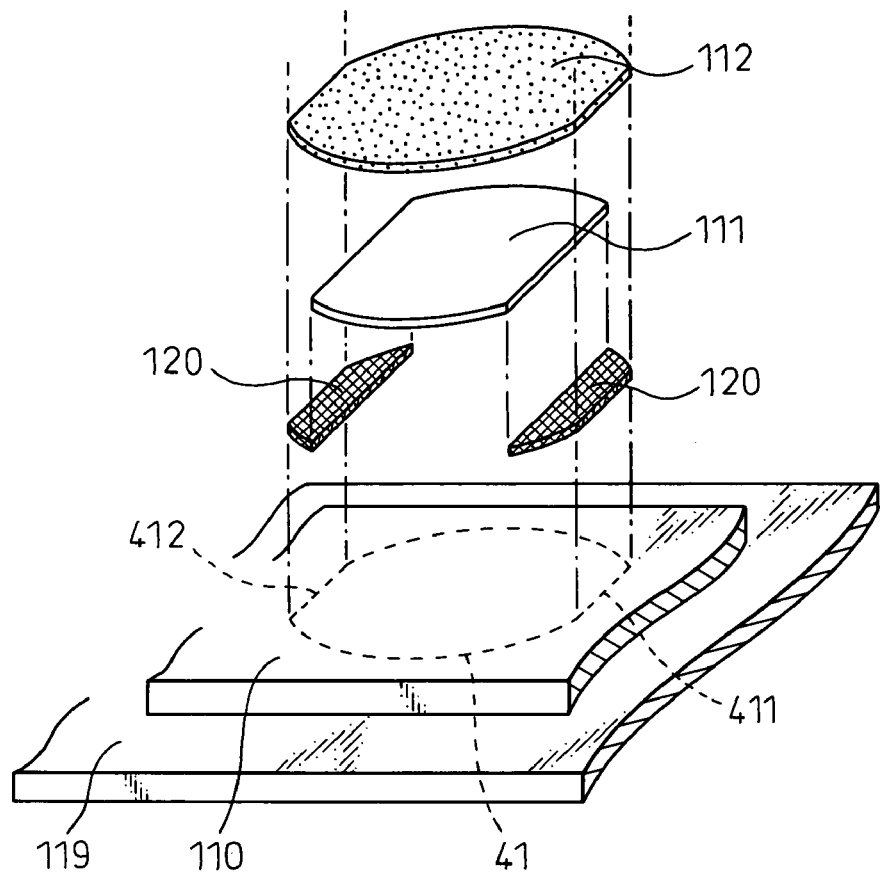
FIG. 16 is an explanatory diagram illustrating a printing step according to Example 2.

In the printing step, as shown in FIG. 16, the dissipating slit layers 120 made of a dissipating material that dissipates when calcined are printed on portions where the slits 12 are to be formed within the punching area 41 on the green sheet 110. In this example, the dissipating slit layers 120 have been printed respectively on the outer circumferential segments respectively containing the straight line portions 411 and 412 of the punching area 41. Then, on a portion within the punching area 41 where the dissipating slit layers 120 are not printed, that is, the portion that is to be left after calcining, the spacer layer 111 made of the same slurry as that used for forming the green sheet 110 is printed to the same thickness as the dissipating slit layers 120 in order to make the portion not printed with the dissipating slit layers 120 substantially flush with the portions printed with the respective dissipating slit layers 120.

In this example, a material composed of carbon particles relatively resistant to heat deformation and capable of accurately retaining the shape of the grooves to be formed in the calcining step is used as the dissipating material for forming the dissipating slit layers 120. Other materials such as carbonized organic particles in a powder form can also be used. Such carbonized organic particles can be obtained by carbonizing powdered organic particles or by pulverizing a carbonized organic material. Further, for such organic materials, polymer materials such as resins or grains such as corns, soybeans, or wheat flour may be used. In this case, the production cost can be reduced.

Figure 17:
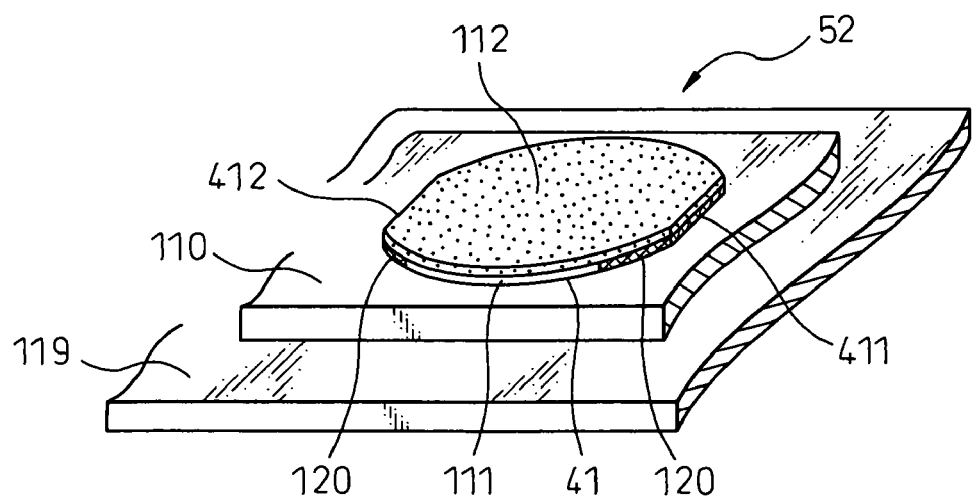
FIG. 17 is an explanatory diagram showing a green sheet after the printing step according to Example 2.

Further, as shown in the figure, an adhesive layer 112 made of the above slurry is printed over the dissipating slit layers 120 and the spacer layer 111 in order to enhance adhesion when stacking the punched out sheet pieces. Then, by punching out the thus printed punching area 41, the dissipating-slit-layer-containing piece 52 can be obtained, as shown in FIG. 17.

In this example, similarly to Example 1, the electrode-containing piece 51s and the dissipating-slit-layer-containing pieces 52 are printed along the longitudinal direction of the long green sheet 110 in the order in which the punched out sheet pieces are to be stacked. Here, the order of printing is determined in advance so that the dissipating-slit-layer-containing pieces 52 will be stacked at positions where the silts 12 are to be formed.

Next, in the intermediate stack forming step, the punching areas 41 are punched out of the green sheet 110 by the punching/stacking device to obtain two kinds of sheet pieces, i.e., the electrode-containing piece 51 and the dissipating-slit-layer-containing piece 52, and the sheet pieces are stacked one on top of another to form the intermediate stack 100.

In the subsequent calcining step, the intermediate stack 100 is calcined, causing the dissipating slit layers 120 to dissipate and thus forming the slits 12 each in the form of a groove recessed into the piezoelectric layer 11 inwardly from the outer circumferential surface of the ceramic stack 10 completed as shown in FIG. 18.

In other respects, the fabrication method is the same as that of Example 1.

In the fabrication method of this example, the slits 12, each in the form of a groove recessed into the piezoelectric layer inwardly from the outer circumferential surface, are formed in the side faces 101 and 102 of the ceramic stack 10, as shown in FIG. 18. As a result, in the stacked piezoelectric element 1 fabricated using this ceramic stack 10, the slits 12 act to relieve the stress caused by the deformations of the piezoelectric layers 11 during driving. This prevents the delamination of the conductive adhesive 31, the delamination/cracking of the piezoelectric layers 11, etc. and serves to improve the durability of the stacked piezoelectric element 1 as a whole.

Further, in this example, the conductive adhesive 31 can be made to enter not only the electrode recesses 23 but also the slits 12. This serves to further enhance the anchoring effect of the conductive adhesive 31 applied over the side faces of the ceramic stack 10. In this way, the durability of the stacked piezoelectric element 1 can be further improved.

In other respects, this example offers the same effect as achieved in Example 1.

Example 3

This example is based on the ceramic stack 10 of Example 1, but the shapes and positions of the internal electrode layers 21, 22 and the slits 12 are changed in various ways. These changes will be described in detail with reference to FIGS. 18 to 22 which include drawings showing the ceramic stack 10 of the second example.

The shape and position of each of the internal electrode layers 21, 22 can be changed in the desired manner by changing the printing positions of the electrode material 200 and the spacer layer 111 to be printed within the punching area 41 on the green sheet 110 in the printing step.

Further, the shape and position of the slits 12 can be changed in the desired manner by changing the printing positions of the dissipating slit layers 120 and the spacer layer 111 to be printed within the punching area 41 on the green sheet 110 in the printing step or by changing the order in which the electrode-containing pieces 51 and the dissipating-slit-layer-containing pieces 52 are to be printed or stacked.

Figure 19:
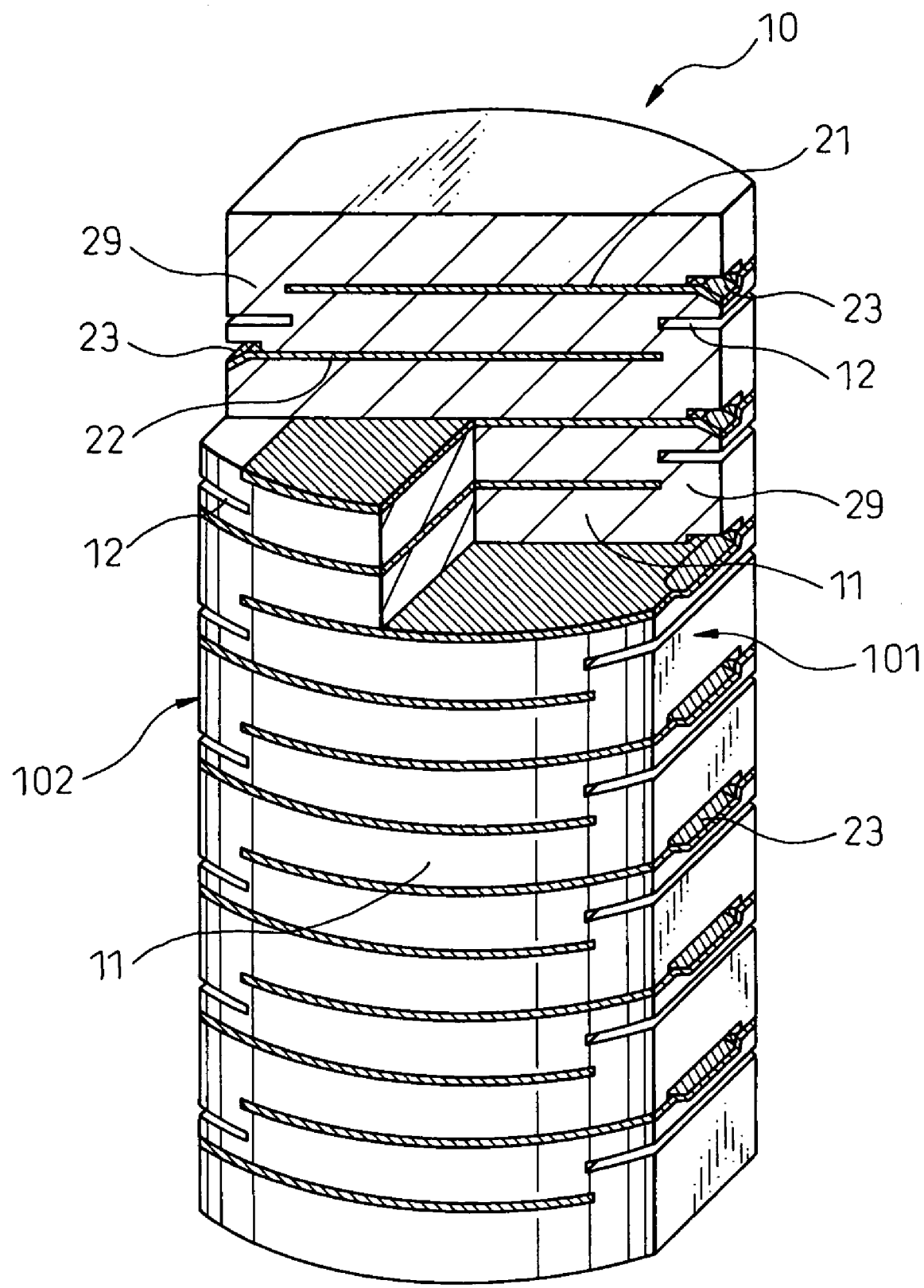
FIG. 19 is an explanatory diagram showing an alternative structure of the ceramic stack according to Example 3.
Figure 20:
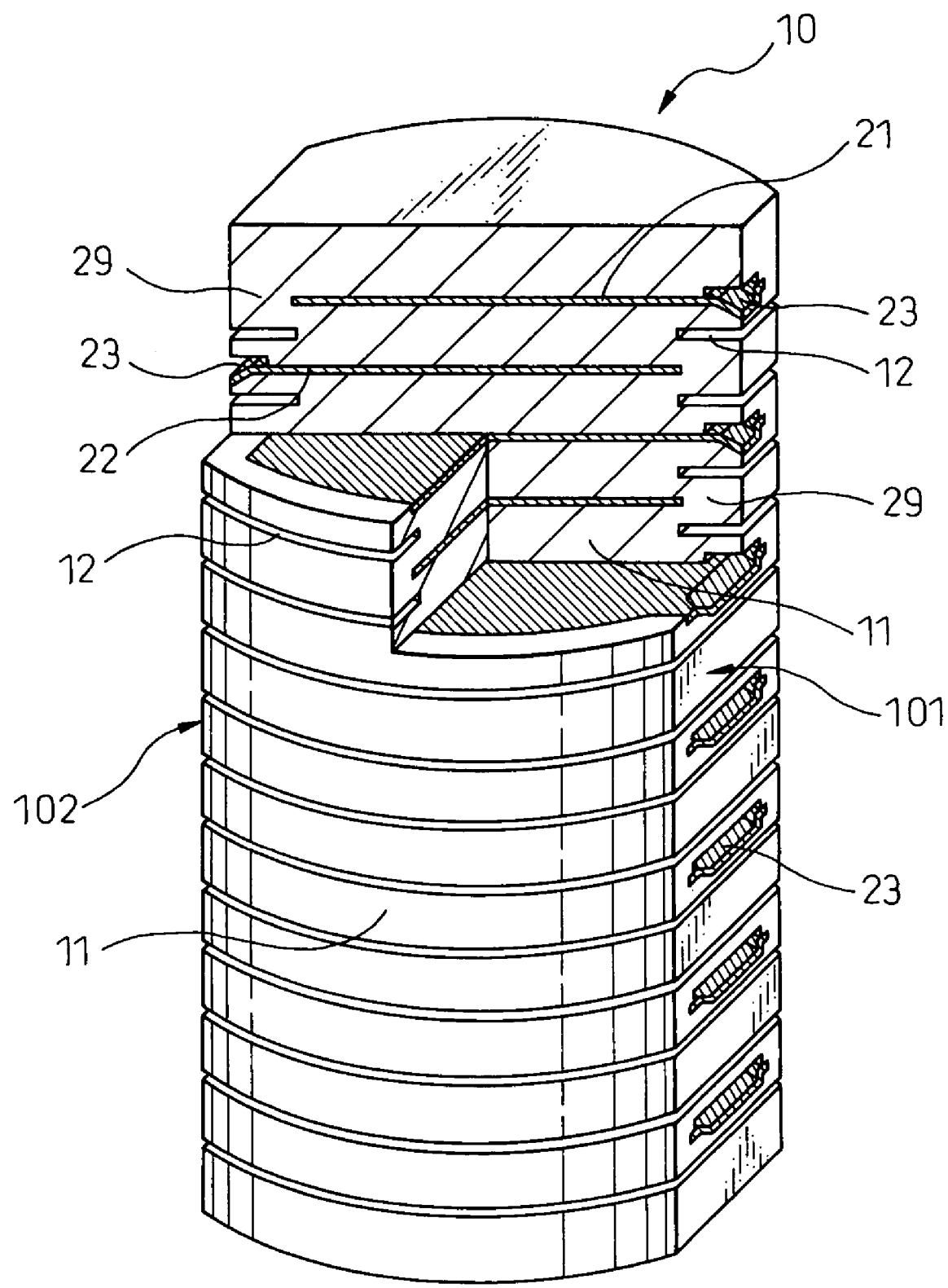
FIG. 20 is an explanatory diagram showing an alternative structure of the ceramic stack according to Example 3.
Figure 21:
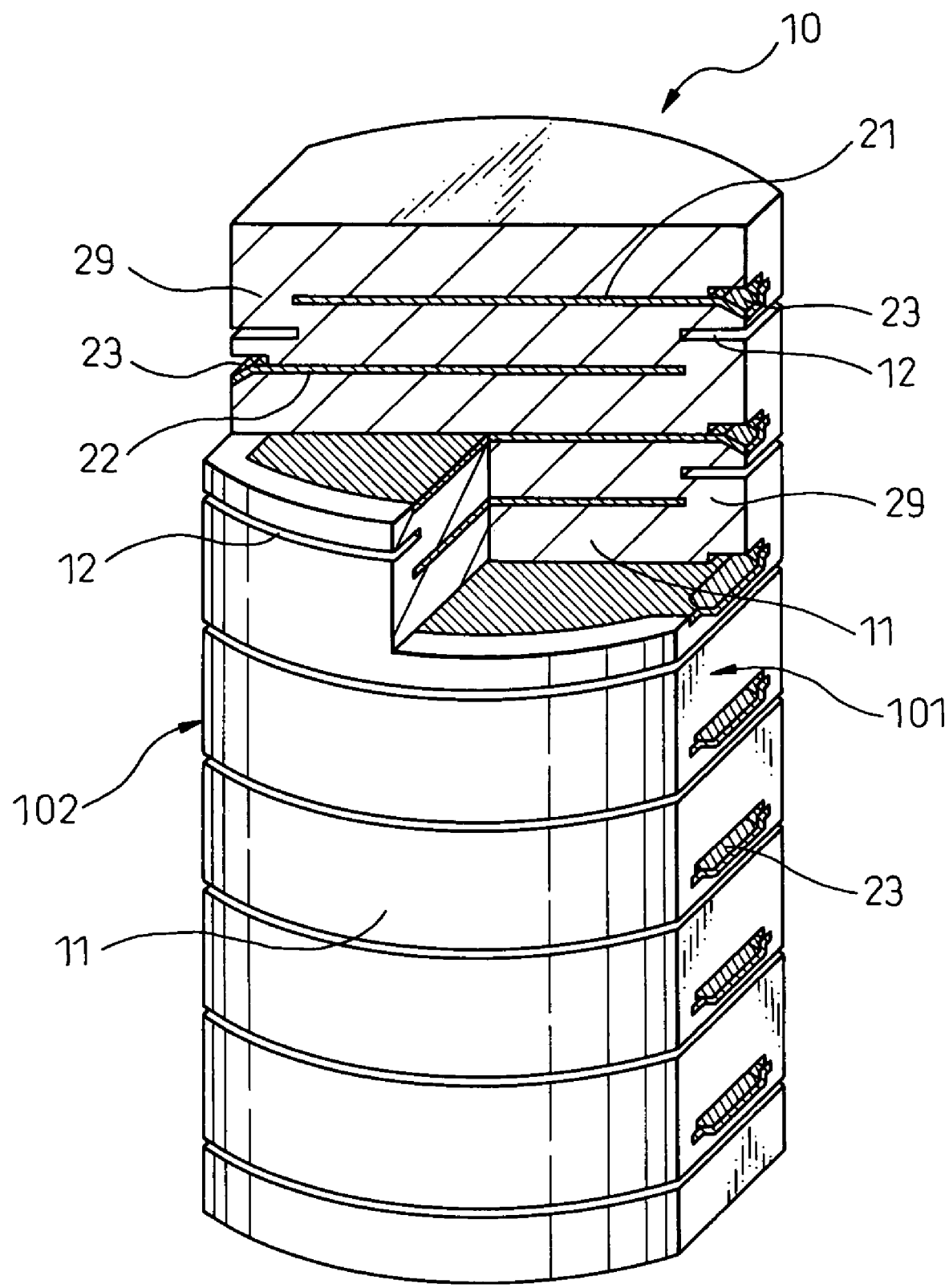
FIG. 21 is an explanatory diagram showing an alternative structure of the ceramic stack according to Example 3.
Figure 22:
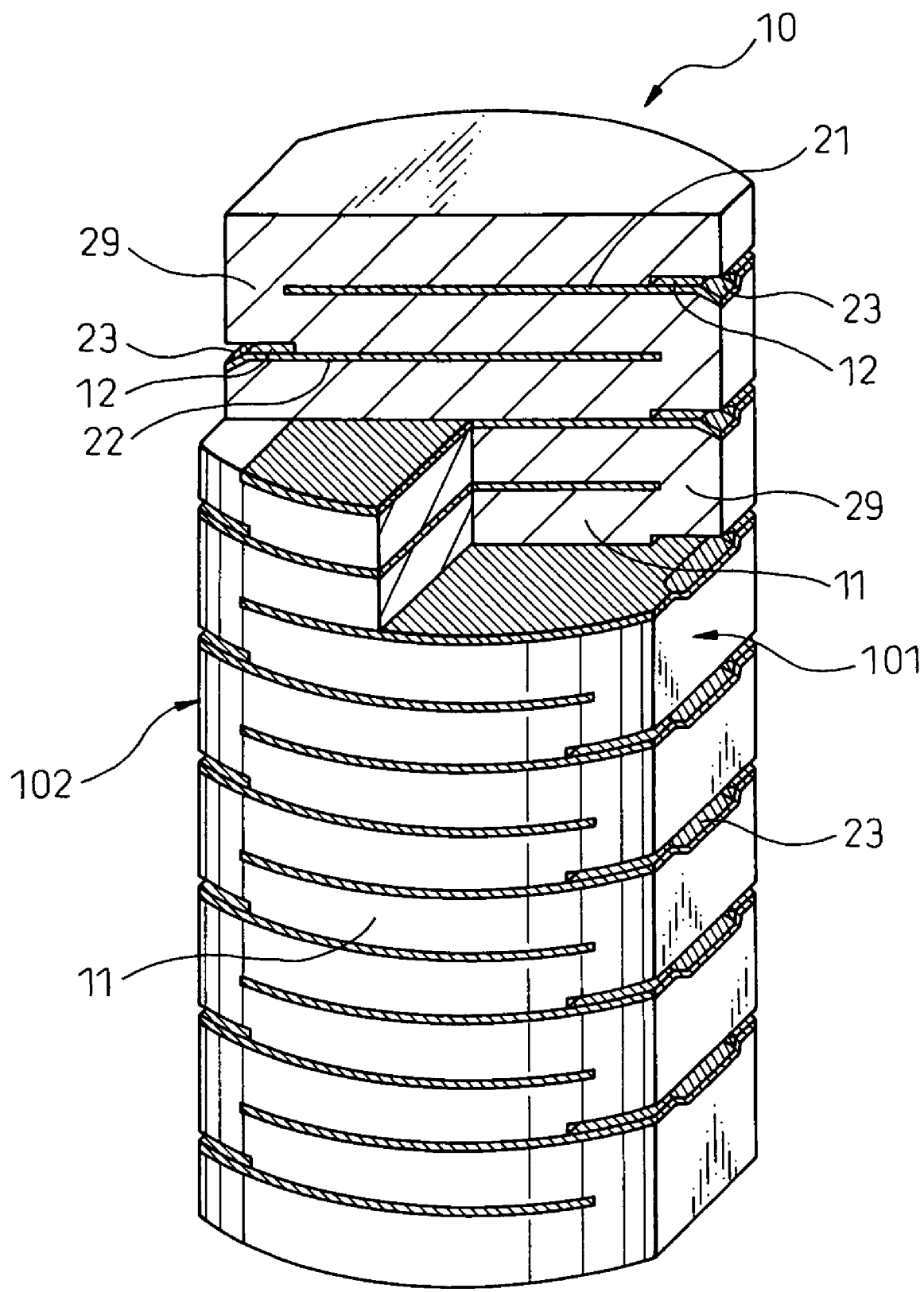
FIG. 22 is an explanatory diagram showing an alternative structure of the ceramic stack according to Example 3.

The internal electrode layers 21, 22 may each be formed so that only an edge portion in the side face 101 or 102 is tucked inside, as shown in FIGS. 18, 19, and 22, or so that the entire edge portion except the portion thereof exposed in the side face 101 or 102 is tucked inside, as shown in FIGS. 20 and 21. Alternatively, the internal electrode layers 21, 22 may each be formed so that the entire outer circumferential edge thereof is exposed.

The slits 12 may be formed so as to interpose between adjacent internal electrode layers 21, 22, as shown in FIGS. 18 to 21, or so as to lie alongside the respective internal electrode layers 21, 22, as shown in FIG. 22.

Further, the slits 12 may be formed so as to interpose between all adjacent internal electrode layers 21, 22, as shown in FIGS. 18 and 20, or so as to interpose between adjacent internal electrode layers 21, 22 in every other layer or in every several layers, as shown in FIGS. 19 and 21.

Furthermore, the slits 12 may each be formed only in a portion of the outer circumferential surface (for example, in the side face 101 or 102), as shown in FIGS. 18, 19, and 22, or around the entire outer circumference, as shown in FIGS. 20 and 21.

What is claimed is:

1. A stacked piezoelectric element comprising: a ceramic stack constructed by alternately stacking a piezoelectric layer made of a piezoelectric material and an internal electrode layer having electrical conductivity; and an external electrode bonded to side faces of said ceramic stack via an electrically conductive adhesive, wherein said each side face of said ceramic stack is provided with an electrode recess formed by indenting a portion of an edge of said internal electrode layer in a stacking direction thereof thereby forming a gap between said portion of an edge of said internal electrode layer and said piezoelectric layer, and said electrically conductive adhesive is applied so as to enter said electrode recess.

2. A stacked piezoelectric element as claimed in claim 1, wherein the portion of said internal electrode layer that is exposed in said electrode recess is sloped at an angle relative to a plane orthogonal to said stacking direction.

3. A stacked piezoelectric element as claimed in claim 1, wherein said ceramic stack has an electrode tucking structure in which at least a portion of said edge of said internal electrode layer is tucked inside said ceramic stack and not exposed outside thereof, and wherein an outer circumferential surface of said ceramic elongated circumferentially and recessed from said outer circumferential surface into said piezoelectric layer.

* * * * *